United States Patent [19]

Kumada

[11] Patent Number: 5,488,925

[45] Date of Patent: Feb. 6, 1996

[54] GAS HANDLING DEVICE ASSEMBLY USED FOR A CVD APPARATUS

[75] Inventor: Masatoshi Kumada, Kawasaki, Japan

[73] Assignee: Fujitsu Limited, Kawasaki, Japan

[21] Appl. No.: 288,926

[22] Filed: Aug. 11, 1994

[30] Foreign Application Priority Data

Oct. 28, 1993  [JP]  Japan .................................. 5-270681

[51] Int. Cl.⁶ ................................................. C23C 16/00
[52] U.S. Cl. ......................................... 118/715; 137/884
[58] Field of Search ........................ 118/715; 137/271, 137/613, 884

[56] References Cited

U.S. PATENT DOCUMENTS

| | | | |
|---|---|---|---|
| 3,654,960 | 4/1972 | Kiernan | 137/608 |
| 3,665,961 | 5/1972 | Bachmann | 137/608 |
| 3,698,432 | 10/1972 | Kutz | 137/608 |
| 3,756,274 | 9/1973 | Wolfgramm | 137/561 R |
| 4,183,373 | 1/1980 | Kay | 137/269.5 |
| 4,369,031 | 1/1983 | Goldman | 432/198 |
| 5,025,834 | 6/1991 | Stoll | 137/560 |
| 5,215,588 | 6/1993 | Rhieu | 118/715 |
| 5,250,323 | 10/1993 | Miyazaki | 427/255.1 |
| 5,252,134 | 10/1993 | Stauffer | 118/726 |
| 5,282,488 | 2/1994 | Roth | 137/15 |

FOREIGN PATENT DOCUMENTS 152121   7/1987   Japan ..................... 118/715

OTHER PUBLICATIONS

Hydraulics & Pneumatics, What Can You Get In Manifolds vol. 16 No. 11 Nov. 63 pp. 88–89.

*Primary Examiner*—R. Bruce Breneman
*Assistant Examiner*—Jeffrie R. Lund
*Attorney, Agent, or Firm*—Armstrong, Westerman, Hattori, McLeland & Naughton

[57] ABSTRACT

There is provided a gas handling device assembly of which one of gas handling devices can be removed from the gas handling device assembly without loosening other component devices. The gas handling device assembly has a base plate having a top surface and a bottom surface opposite to the top surface. A plurality of through holes extending from the top surface to the bottom surface are formed in the base plate so that the gas flows through the through holes. There is provided a gas-handling device having a mount surface via which the gas-handling device is fixed to the base plate, an inlet port and an outlet port for the gas being formed on the mount surface so that each of the inlet port and the outlet port is connected to one of through holes of the base plate. There is also provided a connecting tube having a first connecting member on one end and a second connecting member on the other end, the first connecting member and the second connecting member facing toward the same direction. The gas handling device is fixed to the top surface of the base plate, and the connecting tube is fixed to the bottom surface of the base plate so that the gas handling device, the through holes, and the connecting tube, together form a predetermined gas-flow circuit.

28 Claims, 15 Drawing Sheets

FIG. 6
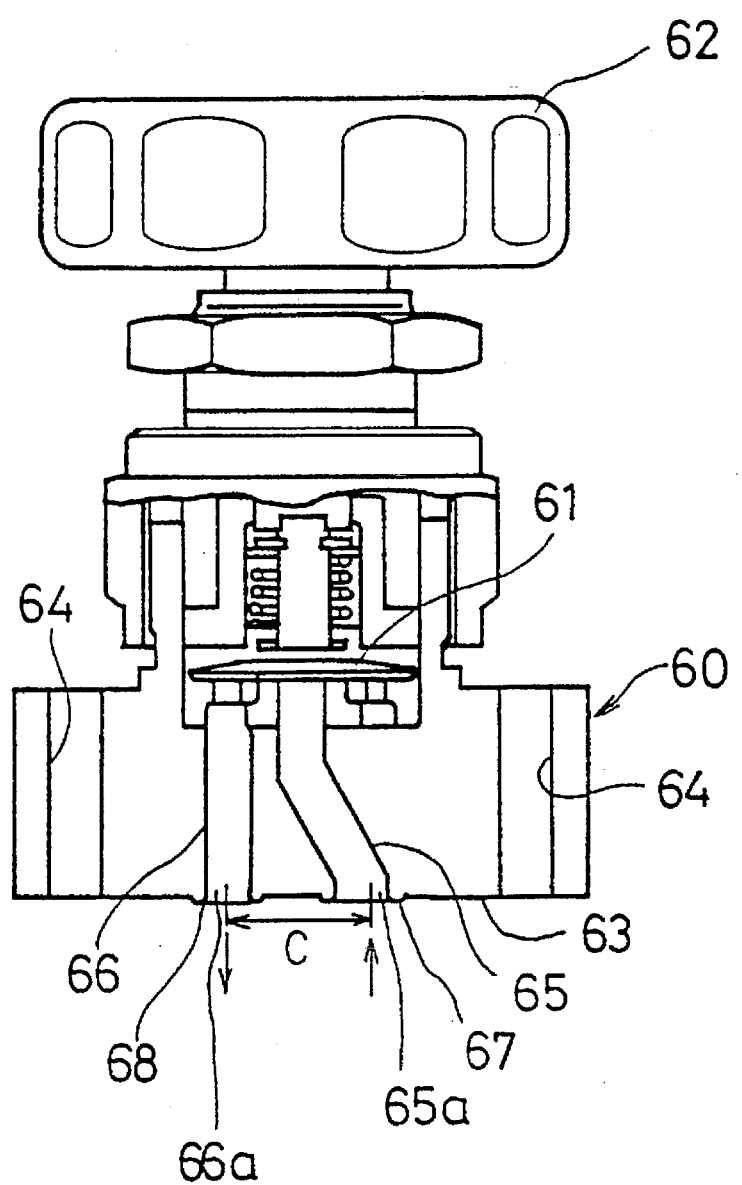
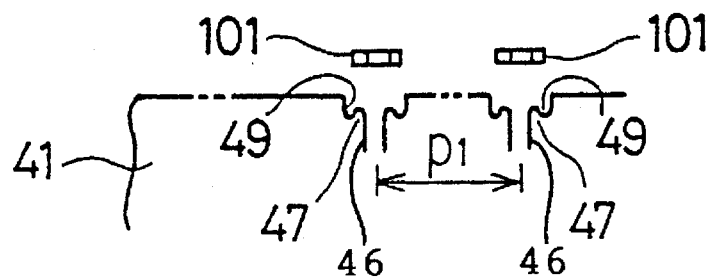

FIG. 8
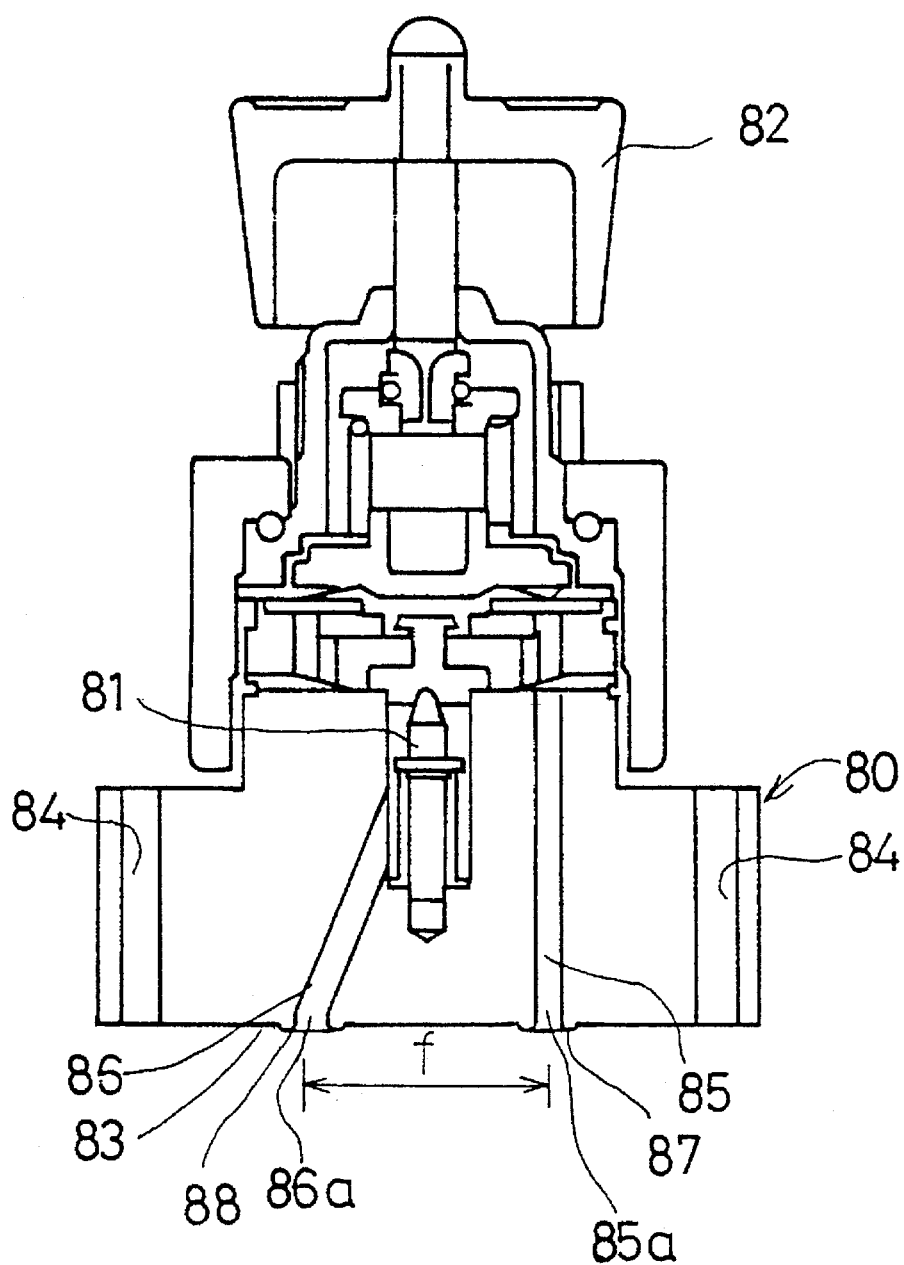
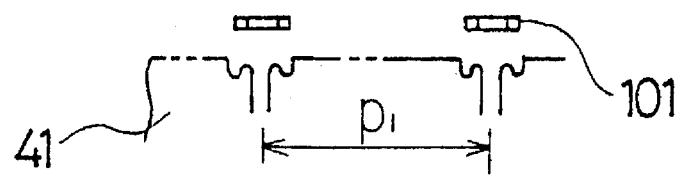

5,488,925

GAS HANDLING DEVICE ASSEMBLY USED FOR A CVD APPARATUS

BACKGROUND OF THE INVENTION

1. Field of the Invention

The present invention relates to a gas handling device assembly, and more particularly to a gas supplying apparatus which is used in a chemical vapor deposition (CVD) apparatus for a semiconductor manufacturing process.

2. Description of the Related Art

A construction of a gas supplying apparatus used for a CVD process is required to supply a process gas in a stable condition so that semiconductor devices having a uniform quality are manufactured. Additionally, the gas supplying apparatus must have a construction of which maintenance can be performed in a short time so that a down time of a manufacturing facility due to the maintenance is minimized. Further, the gas supplying apparatus is preferred to have a compact size so that a manufacturing apparatus is miniaturized.

FIGS. 1A, 1B, 1C and 2 show a conventional gas supplying apparatus 10. The gas supplying apparatus 10 has a gas inlet 11 into which a process gas is supplied and a gas outlet 12 from which the process gas is discharged. Between the gas inlet 11 and the gas outlet 12, there are provided a stop valve 13, a mass flow controlling device 14, a stop valve 15, a filter 16 and a stop valve 17, in that order. These devices are arranged on a base plate, and connected via tubings 19 using connectors 18. Each of the stop valves are mounted on the base plate 35.

The gas supplying apparatus 10 also has a purge system 30 and a gas discarding system 31. The purge system is provided for introducing a purge gas $N_2$ into the gas supplying apparatus 10. The purge system 30 is provided with a pressure controlling valve 32 and a stop valve 33. The gas discarding system 31 is provided for discarding the process gas remaining in the gas supplying system 10. The gas discarding system 31 is provided with a stop valve 34.

In a case in which trichlorosilan ($SiHcl_3$) is used as the process gas, tape heaters (not shown in the figure) are applied to each of the stop valves 13, 15 and 17 and the tubings 19 connecting therebetween so that these devices are heated to prevent the process gas from liquidizing.

The above-mentioned gas supplying apparatus 10 has the following problems.

1) The maintenance is not easy and takes a long time.

It is supposed, for example, that the mass flow controlling device 14 is replaced with a new one. First, the connectors of the mass flow controlling device 14 are disconnected. If the mass flow controlling device 14 is removed from the gas supplying apparatus 10 in this state, sealing surfaces of an inlet port and an outlet port of the mass flow controlling device 14 may be scratched or damaged because there is no clearance between the sealing surface of the inlet and outlet ports of the mass flow controlling device 14 and a sealing end of the respective tube 19 which was connected to the mass flow controlling device 14.

In order to prevent the sealing surface of the mass flow controlling device 14 from being scratched or damaged, other devices such as stop valves 13, 15, 17 and 33 and the pressure controlling valves 32 must be loosened to provide clearances between the inlet and outlet port of the mass flow controlling device 14 and the respective tubings 19.

The operation for making clearances are required for replacing other devices, and thus the maintenance of the gas supplying apparatus 10 may take much labor and a long time.

2) The size of the gas supplying apparatus 10 becomes large.

Each of the component devices of the gas supplying apparatus 10, such as the stop valves 13, 15, 17, 33 and 34, the mass flow controlling valve 14 and the pressure controlling valve 32 has an inlet port and an outlet port on opposite side-faces thereof. The tube 19 and connectors 18 must be provided between the component devices. Accordingly, a relatively long distance is needed between the component devices, which distance is indicated, for example, by distance a between the mass flow controlling device 14 and the stop valve 15 shown in FIG. 2. Therefore, a length b of the gas supplying apparatus becomes long as shown in FIG. 1B.

3) A constant supply of the process gas may not be achieved.

Heating using the tape heater may generates an uneven temperature distribution along the tubings and the component devices. When a gas, which tends to be easily liquidized, is used as the process gas, the process gas may be liquidized at a portion where sufficient heating is not applied. The liquidized gas may block a flow of the process gas, and thus a constant supply of the process gas cannot be achieved.

SUMMARY OF THE INVENTION

It is a general object of the present invention to provide an improved and useful gas handling device assembly in which the above-mentioned disadvantages are eliminated.

A more specific object of the present invention is to provide a gas handling device assembly of which one of gas handling devices can be removed from the gas handling device assembly without loosening other component devices.

Another object of the present invention is to provide a gas handling device assembly of which maintenance can be easily performed in a short time.

In order to achieve the above-mentioned objects, there is provided according to one aspect of the present invention, a gas handling device assembly for controlling a gas, comprising:

a base plate having a top surface and a bottom surface opposite to the top surface, a plurality of through holes extending from the top surface to the bottom surface being formed in the base plate so that the gas flows through the through holes;

at least one gas-handling device having a mount surface via which the gas-handling device is fixed to the base plate, an inlet port and an outlet port for the gas being formed on the mount surface so that each of the inlet port and the outlet port is connected to one of through holes of the base plate; and at least one connecting tube having a first connecting member on one end and a second connecting member on the other end, the first connecting member and the second connecting member facing toward the same direction, wherein the gas handling device is fixed to the top surface of the base plate, and the connecting tube is fixed to the bottom surface of the base plate so that the gas handling device, the through holes and the connecting tube together form a predetermined gas-flow circuit.

According to another aspect of the present invention, there is provided a gas handling device used with a base plate to which the gas handling device is fixed, the base plate having a plurality of through holes as passages for a gas, the gas handling device comprising:

a mount surface via which the gas-handling device is fixed to the base plate; and an inlet port and an outlet port for the gas being formed on the mount surface so that each of the inlet port and the outlet port is connected to one of the through holes of the base plate.

According to another aspect of the present invention, there is provided a gas supplying apparatus supplying a gas to an external device, the gas supplying apparatus comprising:

a base plate having a top surface and a bottom surface opposite to the top surface, a plurality of through holes extending from the top surface to the bottom surface being formed in the base plate so that the gas flows through the through holes;

a stop valve having a mount surface via which the stop valve is fixed to the base plate, an inlet port and an outlet port for the gas being formed on the mount surface so that each of the inlet port and the outlet port is connected to one of the through holes of the base plate;

a pressure controlling valve having a mount surface via which the pressure controlling valve is fixed to the base plate, an inlet port and an outlet port for the gas being formed on the mount surface so that each of the inlet port and the outlet port is connected to one of the through holes of the base plate;

a flow controller having a mount surface via which the flow controller is fixed to the base plate, an inlet port and an outlet port for the gas being formed on the mount surface so that each of the inlet port and the outlet port is connected to one of the through holes of the base plate; and a plurality of connecting tubes each having a first connecting member on one end and a second connecting member on the other end, the first connecting member and the second connecting member facing toward the same direction, wherein the stop valve, the pressure controlling valve and the flow controller are fixed to the top surface of the base plate, and the connecting tubes are fixed to the bottom surface of the base plate so that the stop valve, the pressure controlling valve, the flow controller, the connecting tube and the through holes together form a predetermined gas-flow circuit.

According to another aspect of the present invention, there is provided a chemical vapor deposition apparatus comprising:

a gas cylinder for supplying a process gas;

a reaction chamber into which the process gas is introduced for performing a chemical vapor deposition; and a gas supplying apparatus supplying a gas to an external device, wherein the gas supplying apparatus comprising:

a base plate having a top surface and a bottom surface opposite to the top surface, a plurality of through holes extending from the top surface to the bottom surface being formed in the base plate so that the gas flows through the through holes;

a stop valve having a mount surface via which the stop valve is fixed to the base plate, an inlet port and an outlet port for the gas being formed on the mount surface so that each of the inlet port and the outlet port is connected to one of the through holes of the base plate;

a pressure controlling valve having a mount surface via which the pressure controlling valve is fixed to the base plate, an inlet port and an outlet port for the gas being formed on the mount surface so that each of the inlet port and the outlet port is connected to one of through holes of the base plate;

a flow controller having a mount surface via which the flow controller is fixed to the base plate, an inlet port and an outlet port for the gas being formed on the mount surface so that each of the inlet port and the outlet port is connected to one of the through holes of the base plate; and a plurality of connecting tube each having a first connecting member on one end and a second connecting member on the other end, the first connecting member and the second connecting member facing toward the same direction, wherein the stop valve, the pressure controlling valve and the flow controller are fixed to the top surface of the base plate, and the connecting tubes are fixed to the bottom surface of the base plate so that the stop valve, the pressure controlling valve, the flow controller, the connecting tube and the through holes together form a predetermined gas-flow circuit.

According to another aspect of the present invention, there is provided a gas supplying method comprising the steps of:

a) supplying a gas to an inlet port of a gas supplying apparatus comprising at least one gas handling device, a base plate having a plurality of through holes and at least one connecting tube, the gas supplied to the gas supplying apparatus flowing into a gas controlling device via one through hole formed in said base plate and flowing out to another through hole, a flowing direction of said gas flow being U-turned by the gas controlling device and the connecting tube; and b) discharging the gas from an outlet of the gas supplying apparatus so that the gas is supplied to an apparatus using the gas at a predetermined condition, the predetermined condition being established by the gas controlling device.

Other objects, features and advantages of the present invention will become more apparent from the following detailed description when read in conjunction with the accompanying drawings.

BRIEF DESCRIPTION OF THE DRAWINGS

FIG. 6 is a cross sectional view of a stop valve shown in FIG. 3;

FIG. 8 is a cross sectional view of a pressure controlling valve shown in FIG. 3;

DETAILED DESCRIPTION OF THE PREFERRED EMBODIMENTS

A description will now be given of a first embodiment of a gas handling device assembly according to the present invention. FIG. 3 and FIGS. 4A, 4B and 4C show a gas supplying apparatus 40 as the gas handling device assembly which is the first embodiment according to the present invention.

The gas supplying apparatus 40 comprises a base plate 41, stop valves 42-1 to 42-5, a mass flow controller 43, a pressure controlling valve 44 and U-shaped tubes 45-1 to 45-4. It should be noted that, as shown in FIG. 4C, each of the U-shaped tubes 45-1 to 45-4 may have a plurality of branches.

Figure 3:
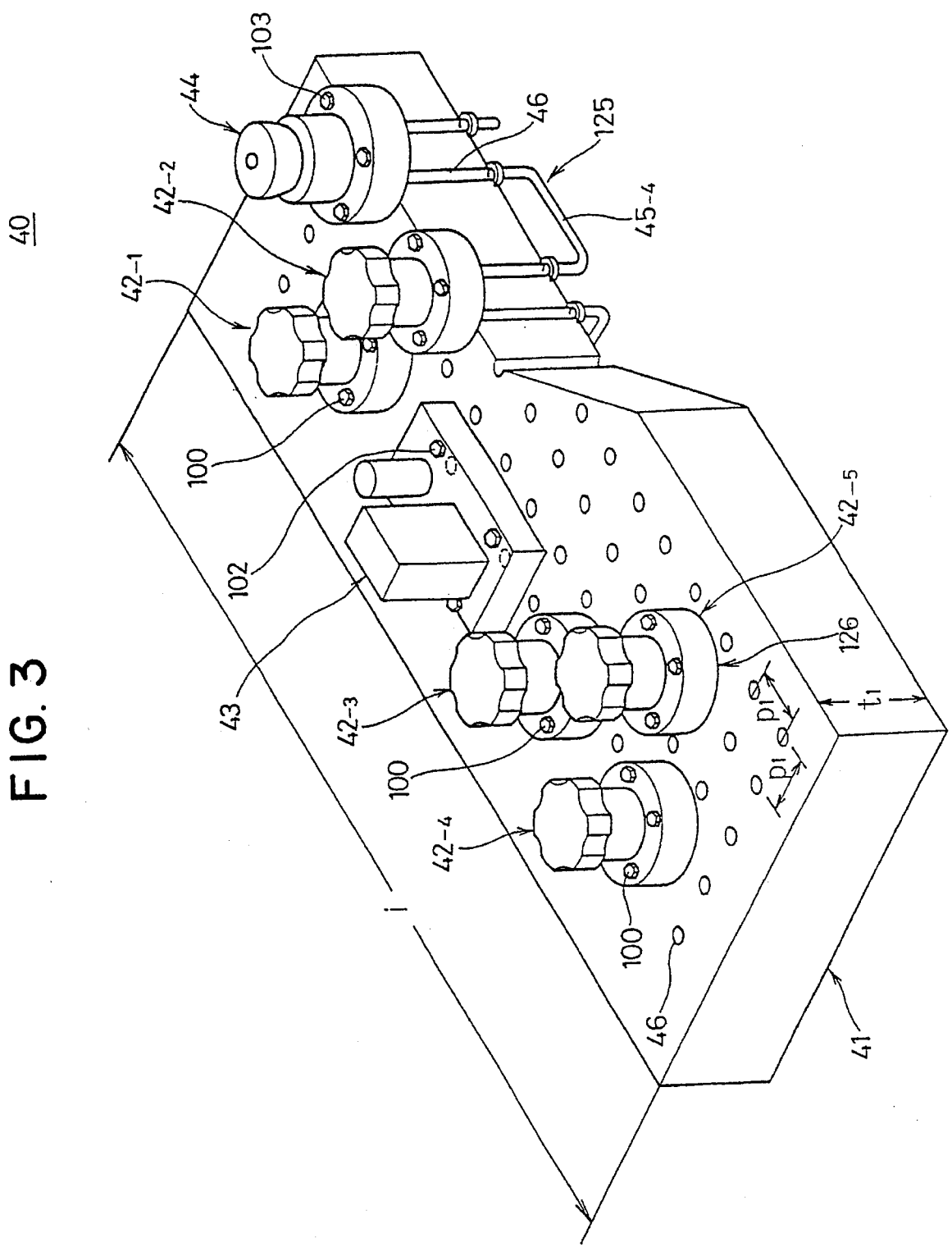
FIG. 3 is a partially cut away perspective view of a first embodiment of a gas supplying apparatus according to the present invention.

The base plate 41 is made of a stainless steel plate such as an SUS316L plate having a thickness $t_1$ as shown in FIG. 3 so that the base plate 41 has a rigidity as well as a corrosion resistance since the process gas is generally a corrosive gas. A material processed by a special treatment is used for extremely corrosive gas to have the base plate 41 cope with the extremely corrosive gas. The base plate 41 has a plurality of through holes 46 extending from a top surface 51 to a bottom surface 52 of the base plate 41. The through holes 46 are arranged in a matrix pattern having pitches $P_1$ in a longitudinal direction and a transverse direction.

Each of the through holes 46 serves as a passage of the process gas. A diameter d1 of each of the through holes 46 is determined to correspond to a standard tube size, for example one-eighth or one quarter of an inch, used for the component devices such as the stop valves 42-1 to 42-5. It should be noted that each of the stop valves 42-1 to 42-5 may be either a manually operable type or a pneumatically operable type.

An inner surface of each of the through holes 46 is treated by a surface finish so that each of the through holes 46 has a smooth inner surface having a maximum roughness of less than sub-micron order. The surface finish is achieved by a mechanical polishing and a subsequent chemical polishing. The smooth inner surface provides a good corrosion resistance and less gas adsorption.

Figure 5A:
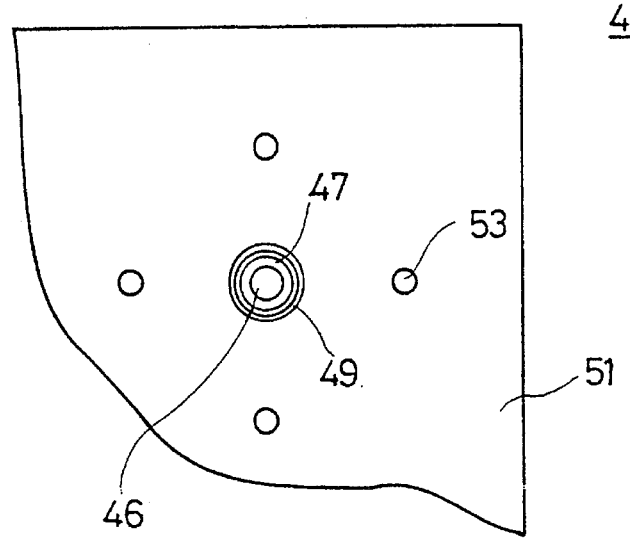
FIG. 5A is an enlarged plan view of a part of a base plate shown in FIG. 3.
Figure 5B:
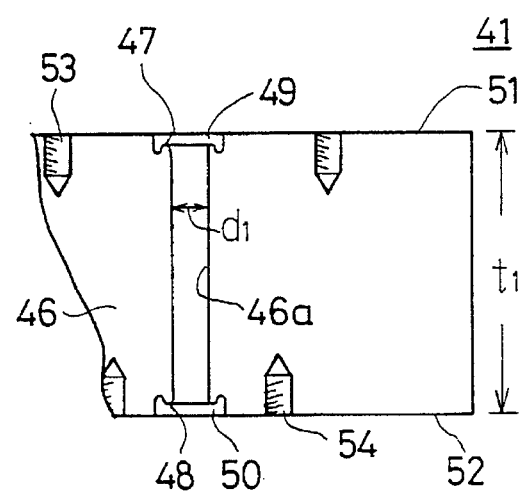
FIG. 5B is an enlarged cross sectional view of the part of the base plate shown in FIG. 5A.
Figure 5C:
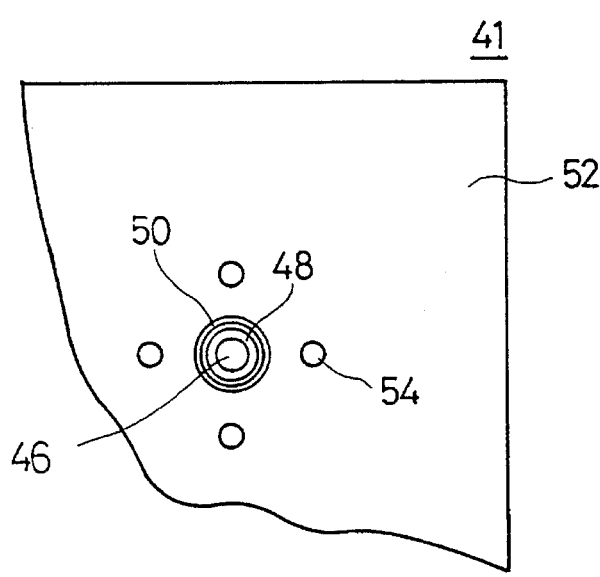
FIG. 5C is an enlarged bottom view of the part of the base plate shown in FIG. 5A.

Each end of each of the through holes 46 has sealing surfaces 47 and 48, respectively, as shown in FIG. 5A, 5B and 5C. That is, a top end of each of the through holes 46 has the sealing surface 47, and a bottom end has the sealing surface 48. Each of the sealing surfaces 47 and 48 is formed in a protruding ring-shape so that the sealing surface 47 or 48 can make a seal in association with a metal gasket 101. Each of the sealing surfaces 47 and 48 are located in a respective counter sinks 49 and 50 so that the sealing surfaces 47 and 48 are recessed beneath the top and bottom surfaces 51 and 52 of the base plate 41, respectively.

Each of the through holes 46 is indicated by a number marked on the top surface 51 and the bottom surface 52 so as to facilitate an exact assembly of the component devices to designated positions on the base plate. Additionally, a plurality of screw holes 53 are formed on the top surface 51 so as to fix the component devices on the top surface 51, and a plurality of screw holes 54 are formed on the bottom surface 52 so as to fix the U-shaped tubes 45-1 to 45-4 on the bottom surface 52.

It should be noted that an arrangement of the component devices is not limited to the specifically disclosed embodiment, and a position of each of the component devices on the base plate 41 may be changed freely. Additionally, a different gas handling apparatus may be assembled on the base plate 41 by changing component devices as desired.

A description will now be given of a structure of each of the component devices mentioned above.

FIG. 6 shows a cross sectional view of the stop valve 42-1 shown in FIG. 3. In FIG. 6, a part of the base plate 41 is illustrated at the bottom of the figure so that a positional relationship between inlet and outlet ports and through holes 46 can be easily understood. Other stop valves 42-2 to 42-5 have the same construction as that of the stop valve 42-1 shown in FIG. 6.

The stop valve 42-1 comprises a valve body 60, a valve member 61 and a operational knob 62 which is operated by an operator to open or close the stop valve 42-1.

The valve body 60 has a mount surface 63 at a bottom surface thereof. A plurality of through holes 64 are formed in the valve body 60 so that the stop valve 42-1 is fixed on the base plate using screws 102 (refer to FIG. 3) inserted into the through holes 64. The valve body 60 also has an inlet hole 65 into which the process gas is introduced and an outlet hole 66 from which the process gas is discharged.

The inlet hole 65 and the outlet hole 66 open on the mount surface 63, and an inlet port 65a and an outlet port 66a are formed on the mount surface 63. A pitch c between the inlet port 65a and the outlet port 66a on the mount surface 63 is the same as the pitch $P_1$ of the through holes 46 of the base plate 41. Additionally, ring seal surfaces 67 and 68 are protrudingly formed on the mount surface 63 around each of the inlet port 65a and the outlet port 66a, respectively.

Figure 7:
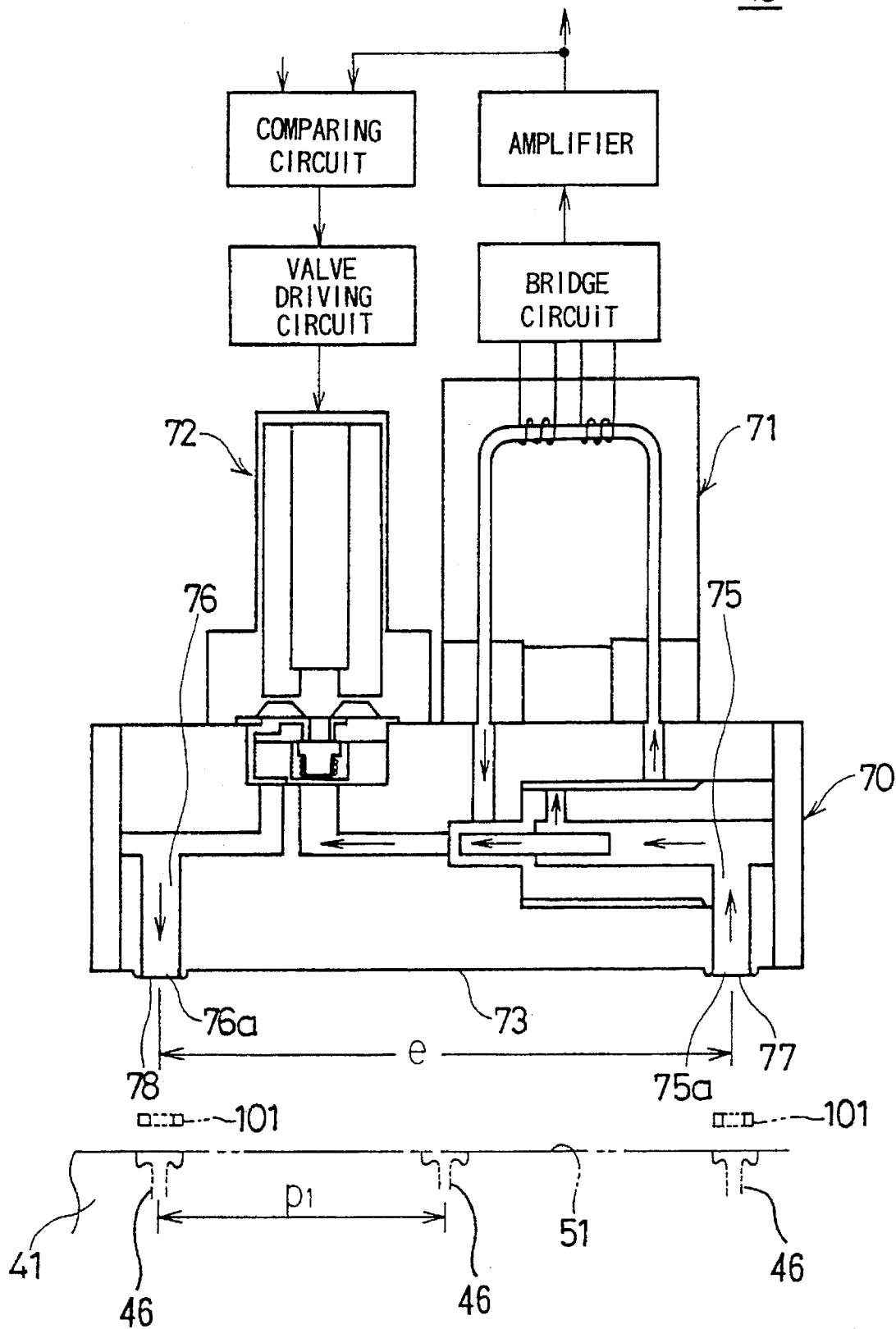
FIG. 7 is a cross sectional view of a mass flow controller shown in FIG. 3.

FIG. 7 shows a cross sectional view of the mass flow controller 43 shown in FIG. 3. In FIG. 7, a part of the base plate 41 is illustrated at the bottom of the figure so that a positional relationship between inlet and outlet ports and through holes 46 can be easily understood.

The mass flow controller 43 comprises a body 70, flow sensing unit 71 and a valve unit 72 so as to maintain a flow of the process gas at a predetermined constant flow rate.

The body 70 has an mount surface 73 at a bottom surface thereof. A plurality of through holes (not shown in the figure) are formed in the body 70, similarly to the above-mentioned stop valve 42-1, so that the mass flow controller 43 is fixed on the base plate using screws inserted into the through holes. The body 70 also has an inlet hole 75 into which the process gas is introduced and an outlet hole 76 from which the process gas is discharged.

The inlet hole 75 and the outlet hole 76 open on the mount surface 73, and an inlet port 75a and an outlet port 76a are formed on the mount surface 73. A pitch e between the inlet port 75a and the outlet port 76a on the mount surface 73 is twice the pitch $P_1$ of the through holes 46 of the base plate 41. Additionally, ring seal surfaces 77 and 78 are protrudingly formed on the mount surface 73 around each of the inlet port 75a and the outlet port 76a, respectively.

FIG. 8 shows a cross sectional view of the pressure controlling valve 44 shown in FIG. 3. In FIG. 8, a part of the base plate 41 is illustrated at the bottom of the figure so that a positional relationship between inlet and outlet ports and through holes 46 can be easily understood.

The pressure controlling valve 44 comprises a valve body 80, a valve member 81 and a operational knob 82 which is operated by an operator to control a pressure of the process gas flowing in the gas supplying apparatus 40.

The valve body 80 has a mount surface 83 at a bottom surface thereof. A plurality of through holes 84 are formed in the valve body 80 so that the pressure controlling valve 44 is fixed on the base plate using screws 103 (refer to FIG. 3) inserted into the through holes 84. The valve body 80 also has an inlet hole 85 into which the process gas is introduced and an outlet hole 86 from which the process gas is discharged.

The inlet hole 85 and the outlet hole 86 open on the mount surface 83, and an inlet port 85a and an outlet port 86a are formed on the mount surface 83. A pitch f between the inlet port 85a and the outlet port 86a on the mount surface 83 is the same as the pitch $P_1$ of the through holes 46 of the base plate 41. Additionally, ring seal surfaces 87 and 88 are protrudingly formed on the mount surface 83 around each of the inlet port 85a and the outlet port 86a, respectively.

Figure 9:
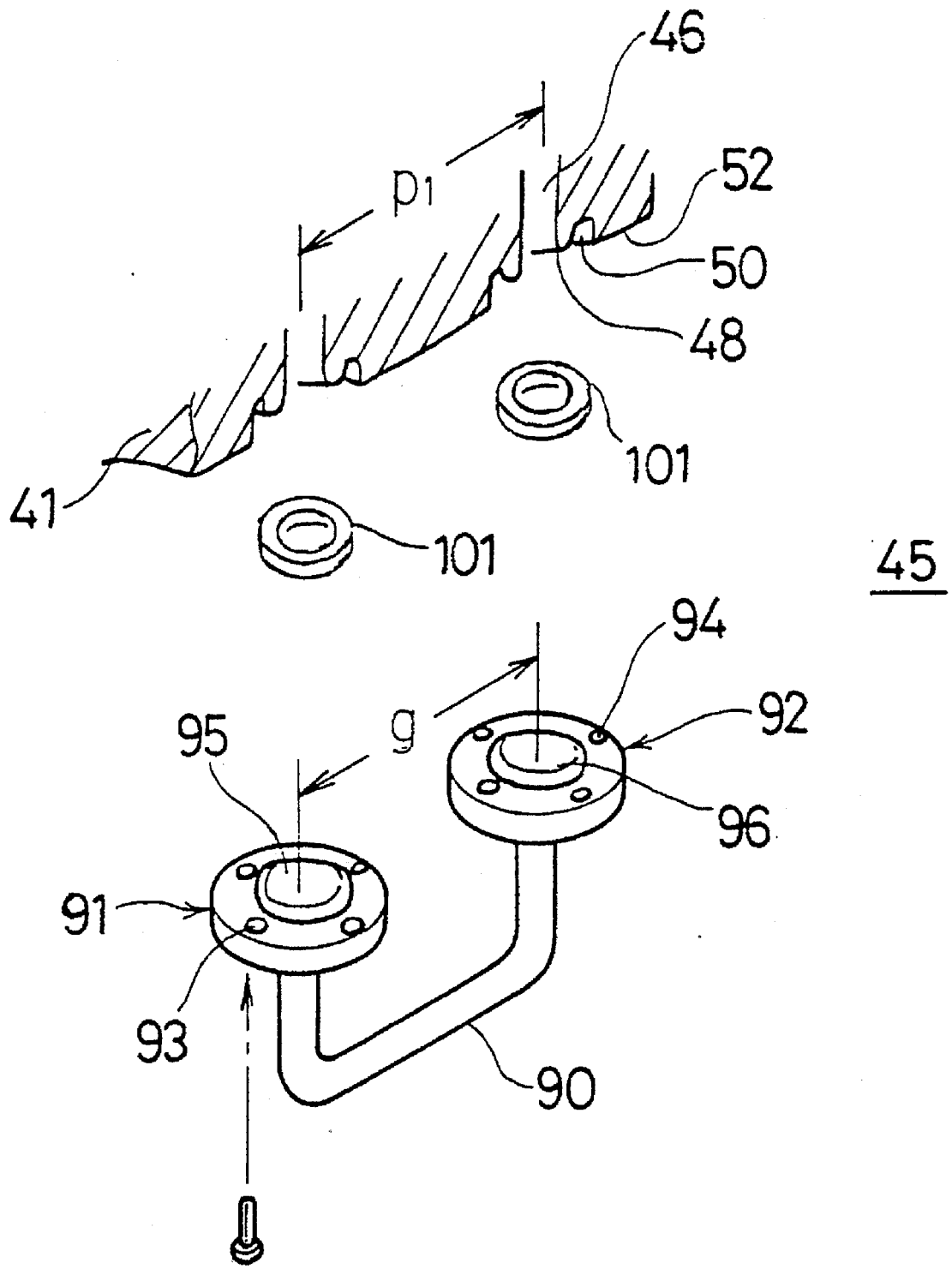
FIG. 9 is a perspective view of a U-shaped tube and a part of the base plate to which the U-shaped tube is fixed.

FIG. 9 shows a U-shaped tube 45 as an example of the U-shaped tubes 45-1 to 45-4.

The U-shaped tube 45 comprises a tubular member 90 bent like a U-shape and connecting members 91 and 92 fixed on opposite ends of the tubular member 90. The connecting member 91 has a plurality of through holes 93 into which a screw is inserted, and similarly, the connecting member 92 has a plurality of through holes 94. The connecting members 91 and 92 have annular protrusions 95 and 96, respectively, the annular protrusions 95 and 96 fitting in the corresponding counter sinks 50 of the base plate 41.

A pitch g between centers of the connecting members 91 and 92 are the same with the pitch $P_1$ of the through holes 46 of the base plate 41.

Figure 10:
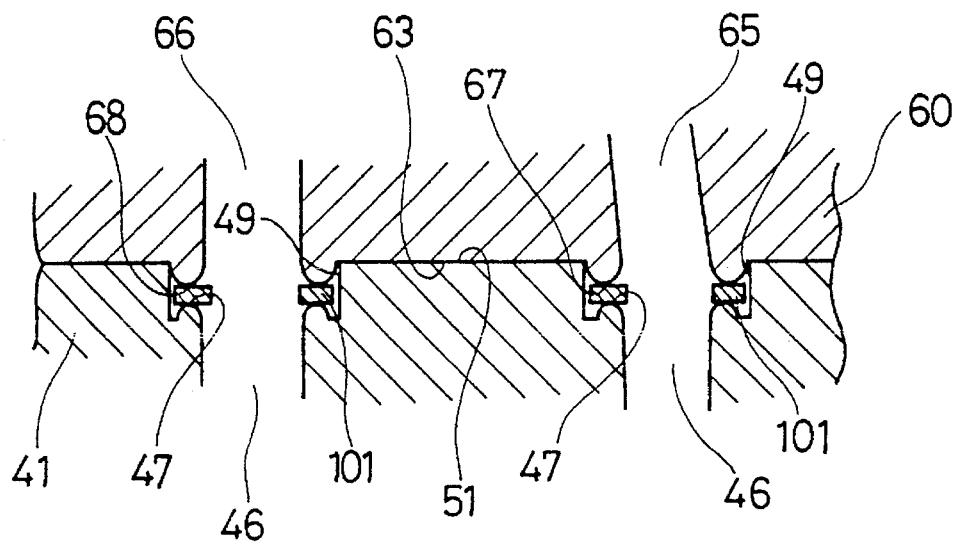
FIG. 10 is an enlarged cross sectional view of a portion where a stop valve shown in FIG. 3 is fixed to the base plate.

Now referring to FIGS. 3 and FIGS. 4A, 4B and 4C, the stop valves 42-1 to 42-5 are fixed at predetermined positions on the top surface 51 of the base plate 41 using screws 100 inserted into each of the through holes 64 and a corresponding screw hole 53 formed on the top surface 51. Each of the sealing surfaces 67 and 68 fits in a corresponding counter sink 47, and the each of the sealing surface 67 and 68 is pressed to the sealing surface 47 of the base plate 41 via a metal gasket 101 as shown in FIG. 10. In order to fix the stop valves 42-1 to 42-5 firmly on the base plate 41 and make a tight seal between the sealing surfaces 67 and 68 and the sealing surfaces 47, the screws 100 are tightened until the mount surface 63 of each of the stop valves 42-1 to 42-5 comes in contact with the top surface 51 of the base plate 41.

Figure 11:
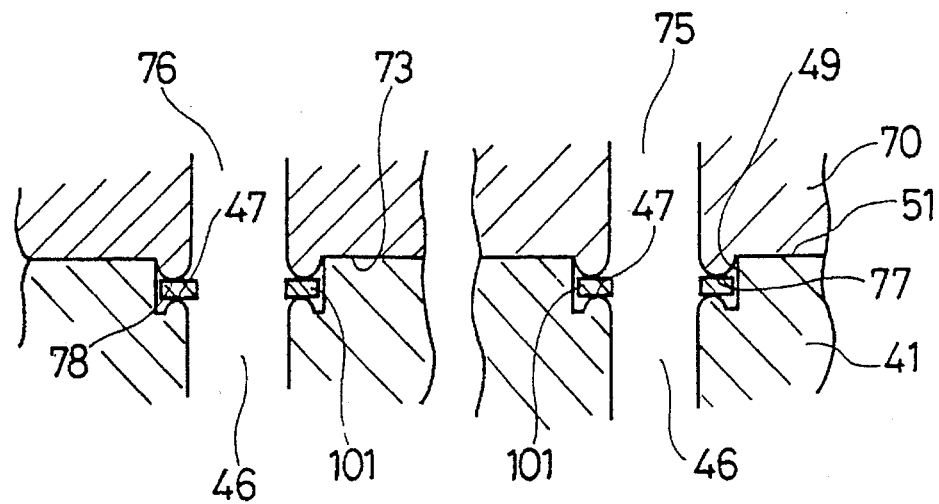
FIG. 11 is an enlarged cross sectional view of a portion where a mass flow controller shown in FIG. 3 is fixed to the base plate.
Figure 12:
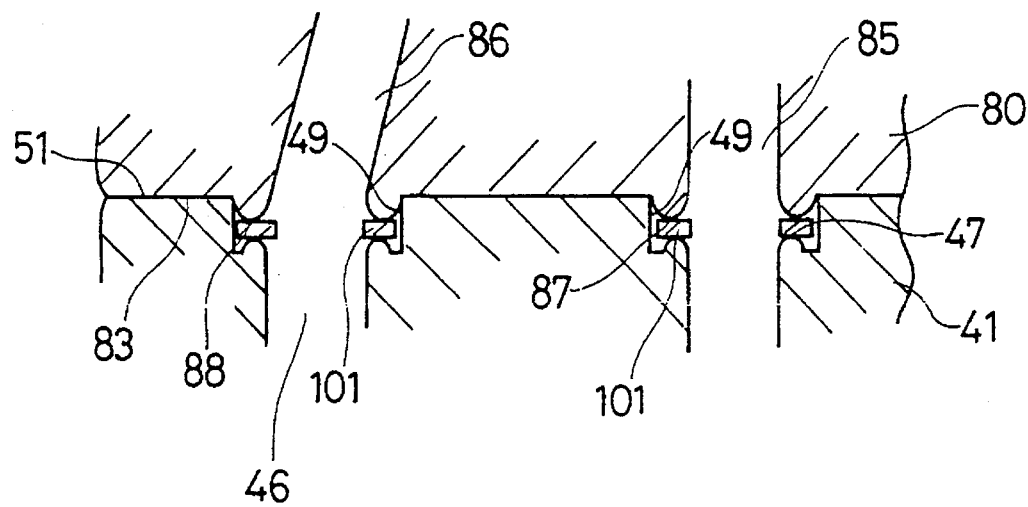
FIG. 12 is an enlarged cross sectional view of a portion where a pressure controlling valve shown in FIG. 3 is fixed to the base plate.
Figure 13:
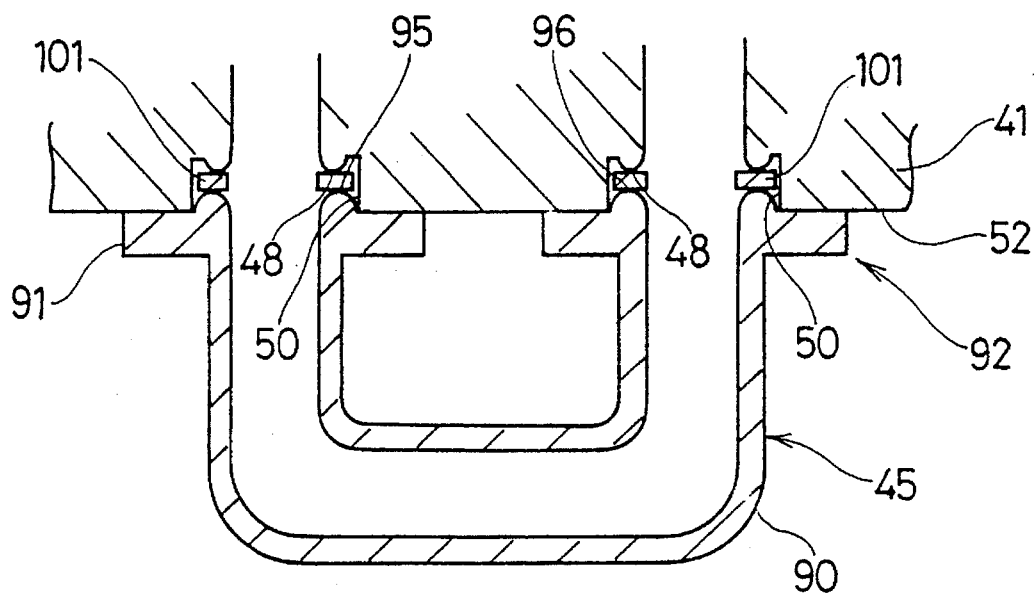
FIG. 13 is an enlarged cross sectional view of a portion where a U-shaped tube shown in FIG. 3 is fixed to the base plate.

Referring to FIG. 13, other component devices such as the mass flow controller 43 and the pressure controlling valve 44 are fixed on the top surface 51 of the base plate 41 in the same manner. FIG. 11 shows a state where the mass flow controller 43 is fixed on to the top surface 51 of the base plate, and FIG. 12 shows that of the pressure controlling valve 44.

The U-shaped tube 45 is fixed on the bottom surface 52 of the base plate 41 in the same manner with the component devices such as the stop valves 42-1 to 42-5 mentioned above. The U-shaped tubes 45-1 to 45-4 are fixed to the bottom surface 52 so that a predetermined gas flow circuit is formed in association with the component devices fixed to the top surface 51.

Figure 4A:
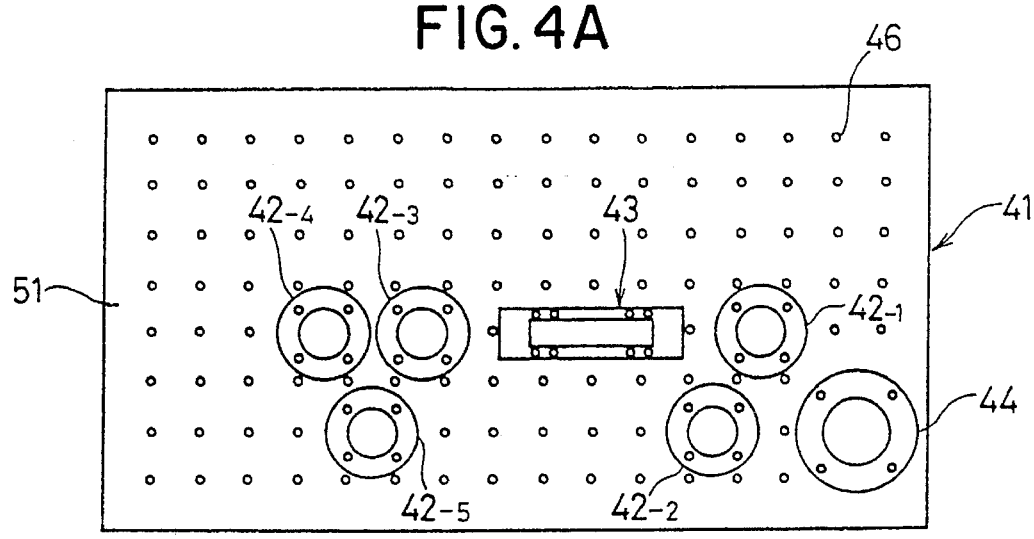
FIG. 4A is a plan view of the gas supplying apparatus shown in FIG. 3.
Figure 4B:
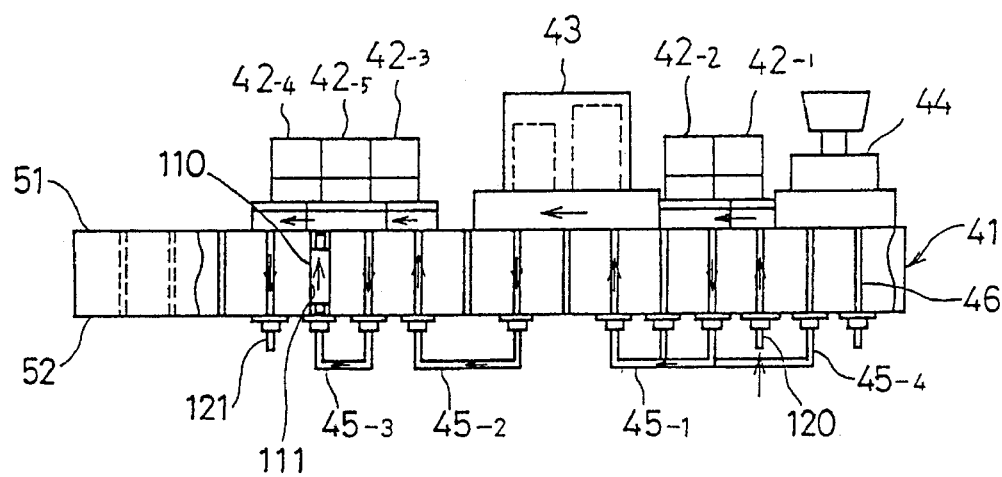
FIG. 4B is a cross sectional view of the gas supplying apparatus shown in FIG. 3.
Figure 4C:
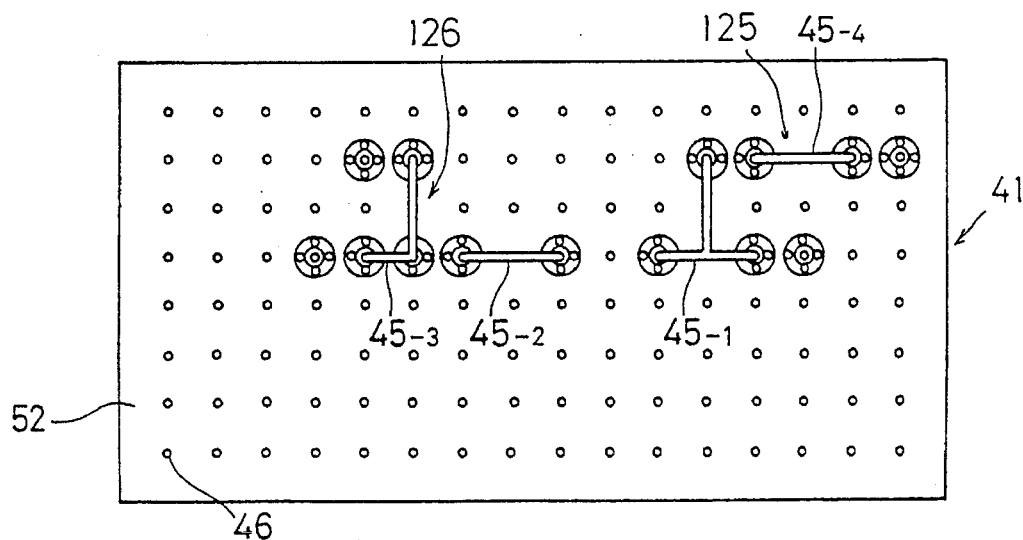
FIG. 4C is a bottom view of the gas supplying apparatus shown in FIG. 3.

In FIG. 4B, a filter hole 111 which accommodates a filter 110 is formed instead of one of through holes 46, and one end of the U-shaped tube 45-3 is fixed to the filter hole 111. It should be noted that the filter 110 may be provided outside the base plate 41. As shown in FIG. 4B, an inlet port 120 and an outlet port 121 of the gas supplying apparatus 40 are provided on the bottom surface 52 of the base plate 41. When the process gas is introduced into the inlet port 120, the process gas passes through the through hole 46, and reaches the stop valve 42-1 located on the top surface 51. The process gas is then leads to another through hole 46 and to the U-shaped tube 45-1 located on the bottom surface 52. The process gas passed through the U-shaped tube 45-1 is lead to another through hole 46, and then enters to the mass flow controller 43. The process gas further passes through another through hole 46, the U-shaped tube 45-2, another through hole 46, the stop valve 42-3, another through hole 46, the U-shaped tube 45-3, the filter 110, the stop valve 42-4 and another through hole 46, in that order, and then the process gas is discharged from the outlet port 121.

The pressure controlling valve 44 and the stop valve 42-2 constitute a purge system 125 through which a purge gas such as $N_2$ gas is purged. The stop valve 42-5 constitutes a gas discarding system 126.

According to the above-mentioned gas supplying apparatus 40, the following advantages are obtained.

1) Maintenance of the gas supplying apparatus is easy and can be performed in a short time.

For example, when the stop valve 42-3 is disconnected from the gas supplying apparatus 40, the stop valve 42-3 can be lifted up and disconnected by unfastening only the screws 100 used for fixing the stop valve 42-3. Because the sealing surfaces 67 and 68 of the stop valve 42-3 move in a direction perpendicular to a plane of the sealing surfaces 67 and 68, there is no risk for scratching or damaging the sealing surfaces 67 and 68.

Accordingly, in the above-mentioned embodiment according to the present invention, one of the component devices including tubes connecting therebetween fixed to the base plate can be independently attached to or detached from the base plate 41 without damage to the sealing surfaces of the component devices.

2) The apparatus can be made compact in overall size.

Figure 1C:
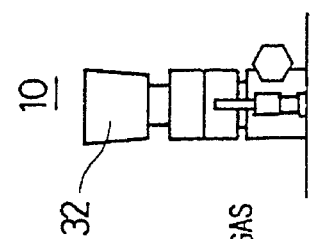
FIG. 1C is a side view of the gas supplying apparatus shown in FIG. 1A.
Figure 1A:
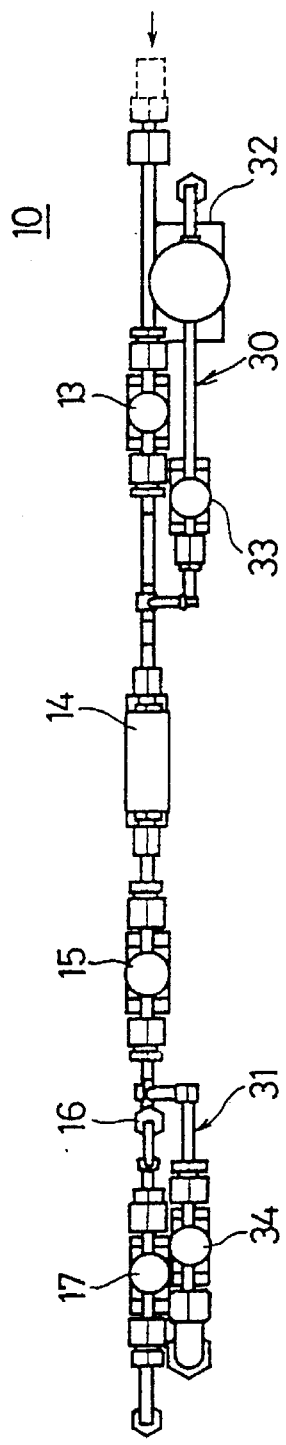
FIG. 1A is a plan view of a conventional gas-supplying apparatus.
Figure 1B:
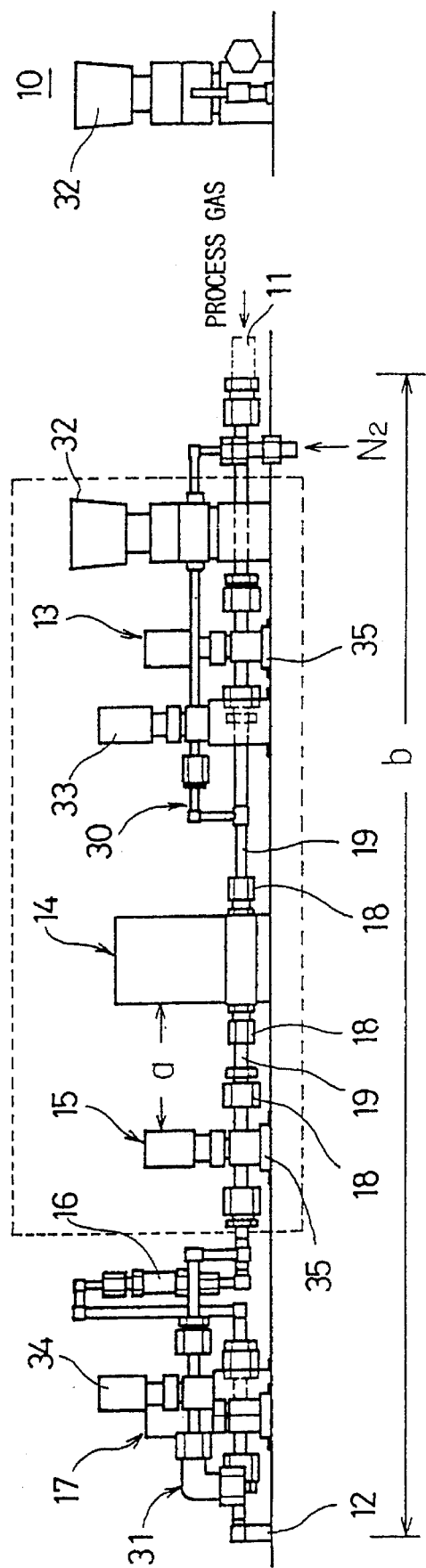
FIG. 1B is a front view of the gas supplying apparatus shown in FIG. 1A.
Figure 2:
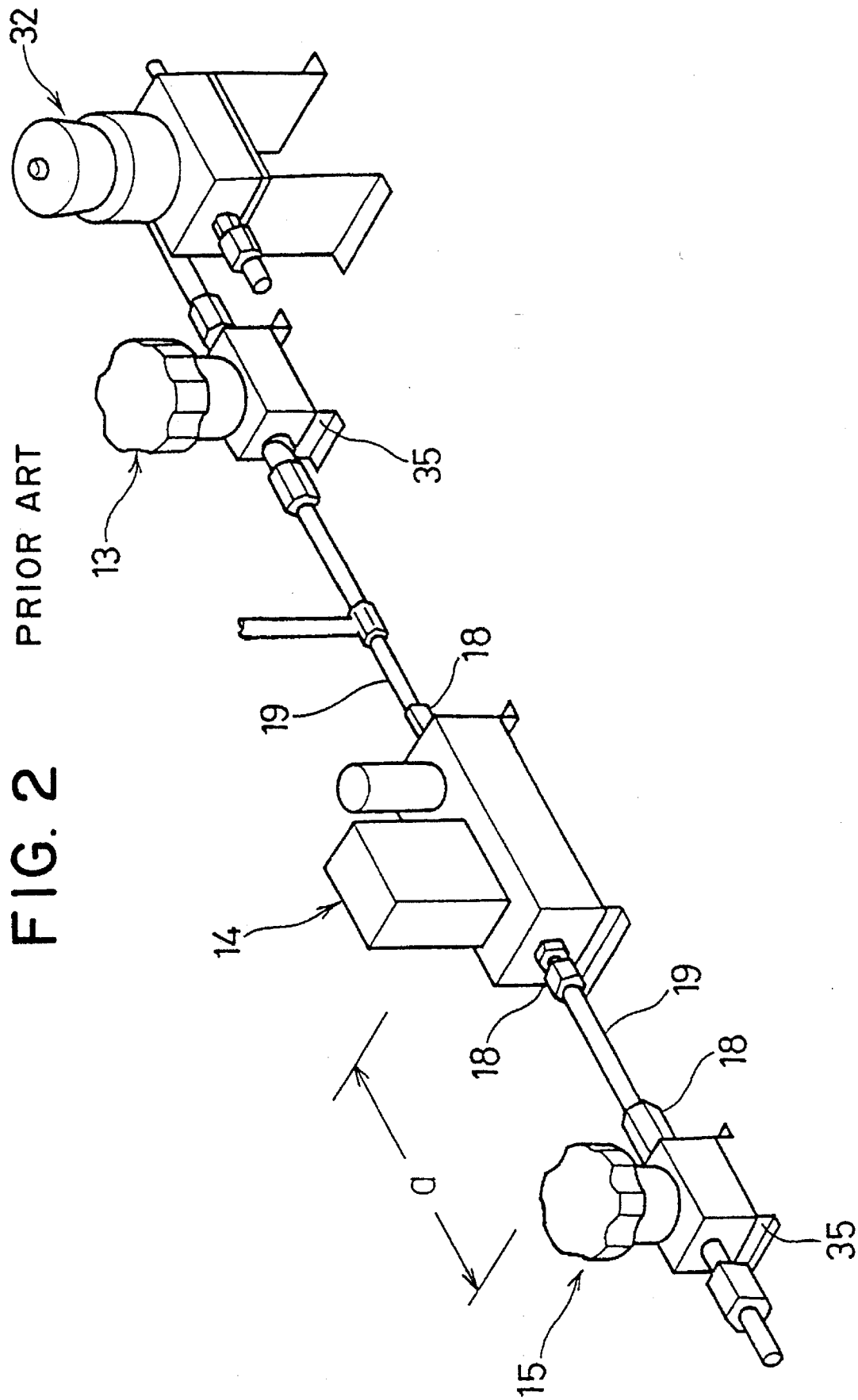
FIG. 2 is a perspective view of a part of the gas supplying apparatus shown in FIG. 1A.

Since each of the component devices is connected via the U-shaped tube provided on the bottom surface of the base plate, a space for a tube is not needed between the component devices. Accordingly, the component devices can be positioned as close as possible to each other, and thus a length of the gas supplying apparatus 40 is much shorter than the length b of the conventional gas supplying apparatus 10 shown in FIG. 1B.

A description will now be given of a second embodiment according to the present invention. FIG. 14 and FIGS. 15A, 15B and 15C show a gas supplying apparatus 40A which is the second embodiment according to the present invention. In these figures, parts that are the same as the parts shown in FIG. 3 and FIGS. 4A, 4B and 4C are given the same reference numerals, and descriptions thereof will be omitted.

The gas supplying apparatus 40A is adapted to handle a gas easily liquidized such as trichlorosilan ($SiHcl_3$). The difference between the first embodiment and the second embodiment is in that a plurality of heater holes 130, each of which can accommodate a sheath heater 131, are additionally formed in a base plate 41A of the second embodiment. The heater holes 130 are formed on a bottom surface of the base plate 41A, and arranged in a matrix pattern.

The heater 131 is inserted into each of the heater holes 130 near the stop valves 42-1 to 42-5. Additionally, a thermo-coupling 132 is provided in one of the heater holes located in the center of the gas supplying apparatus 40A.

Figure 17:
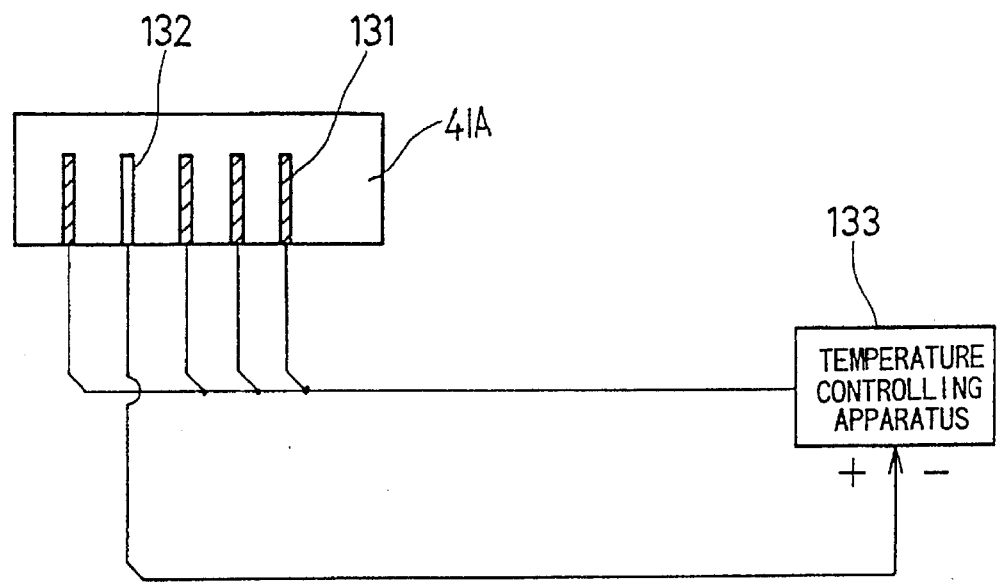
FIG. 17 is an illustration for explaining a control performed by sheath heaters shown in FIG. 15B.

The sheath heaters 131 and the thermo-coupling 132 are connected to a temperature controlling apparatus 133 as shown in FIG. 17. The temperature controlling apparatus 133 measures the temperature of the base plate 41A by means of the thermo-coupling 132, and controls a current supplied to the sheath heaters 131 when there in a difference between the measured temperature and a desired temperature of the base plate 41A. An accuracy of the temperature control performed by the temperature controlling apparatus 133 may be improved by providing a plurality of sheath heaters 131.

It should be noted that the sheath heaters 131 may be connected either in parallel or serial. Additionally, the U-shaped tubes of the second embodiment may be provided with tape heaters (not shown in the figure).

According to the above-mentioned second embodiment, the following advantages are obtained in addition to the advantages of the first embodiment according to the present invention.

1) Maintenance can be easily performed.

The component devices such as the stop valve 42-3 can be disconnected from the gas supplying apparatus 40A without removing the sheath heater 131. Additionally, maintenance for the U-shaped tubes are not needed since the U-shaped tubes are not directly connected to the component devices.

2) The process gas can be supplied in a constant condition.

Since through holes 46 through which the process gas flows are heated to an appropriate temperature, the process gas such as trichlorosilan is not liquidized. Accordingly, no blockage due to a liquidized process gas is generated, and thus a constant flow of the process gas can be obtained.

Figure 14:
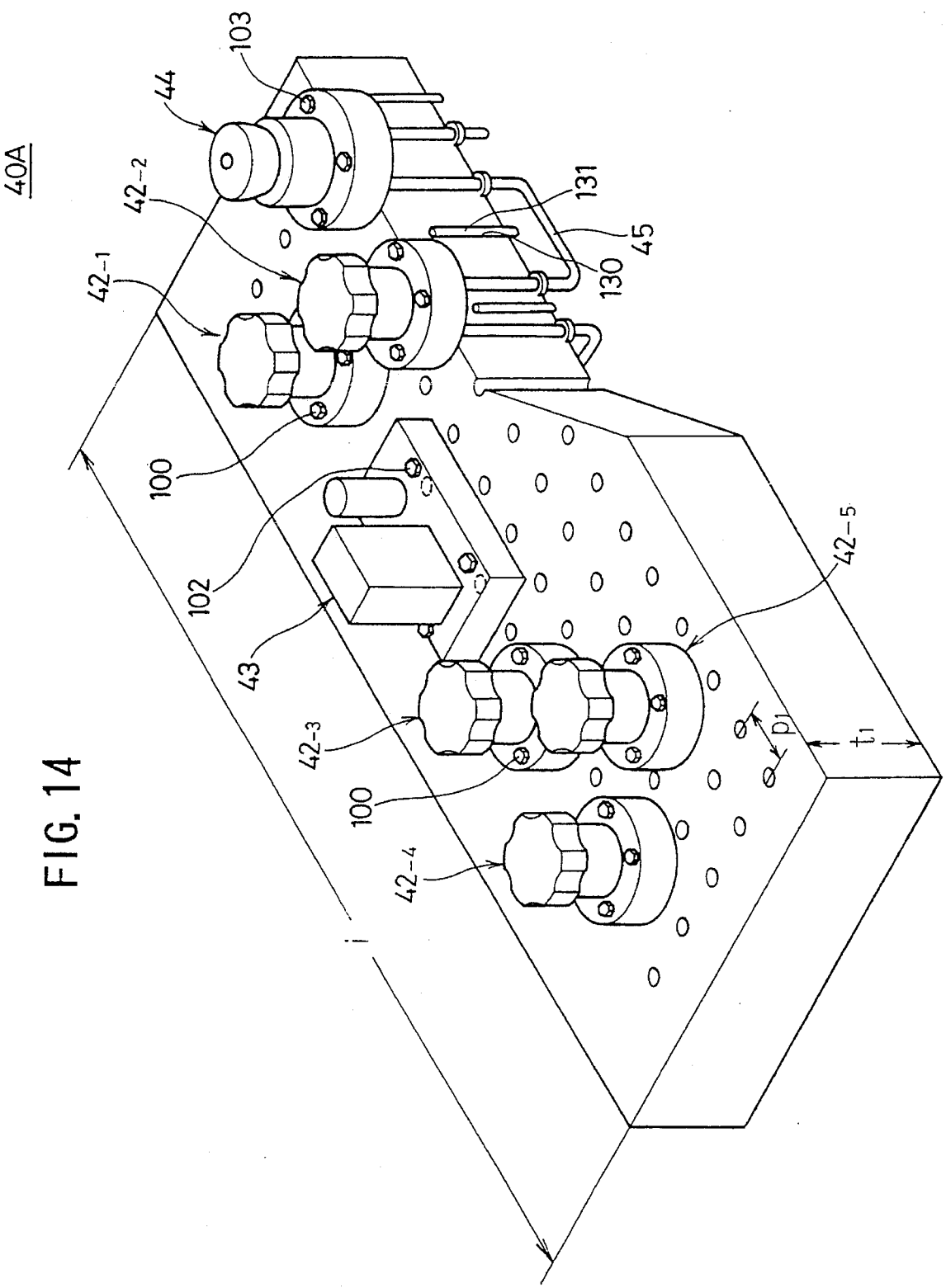
FIG. 14 is a partially cut away perspective view of a second embodiment of a gas supplying apparatus according to the present invention.
Figure 15A:
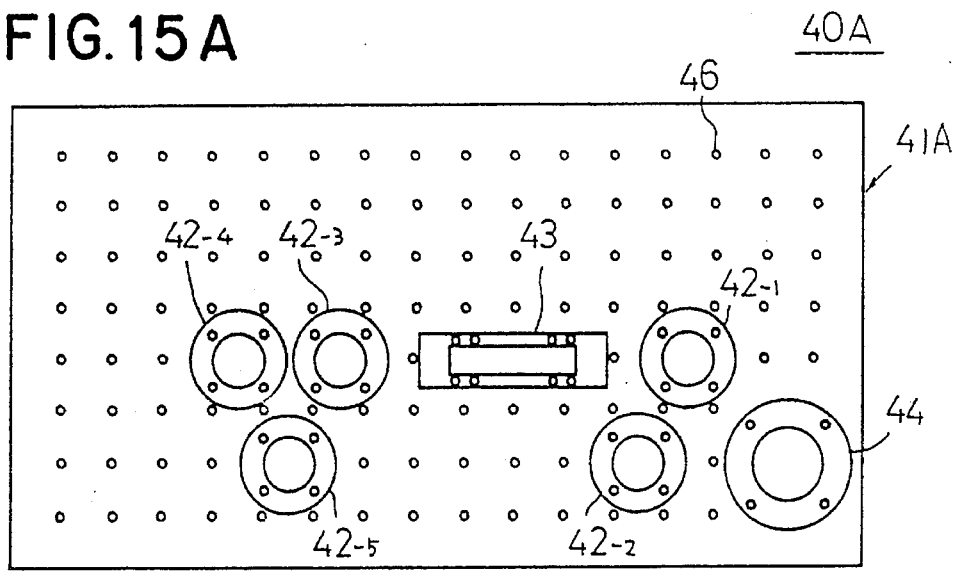
FIG. 15A is a plan view of the gas supplying apparatus shown in FIG. 14.
Figure 15B:
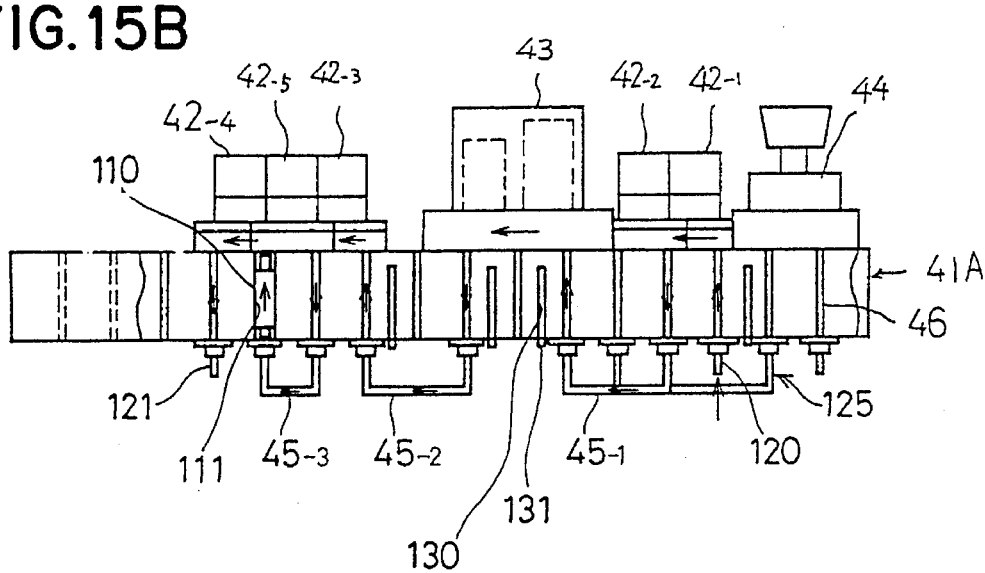
FIG. 15B is a cross sectional view of the gas supplying apparatus shown in FIG. 14.
Figure 15C:
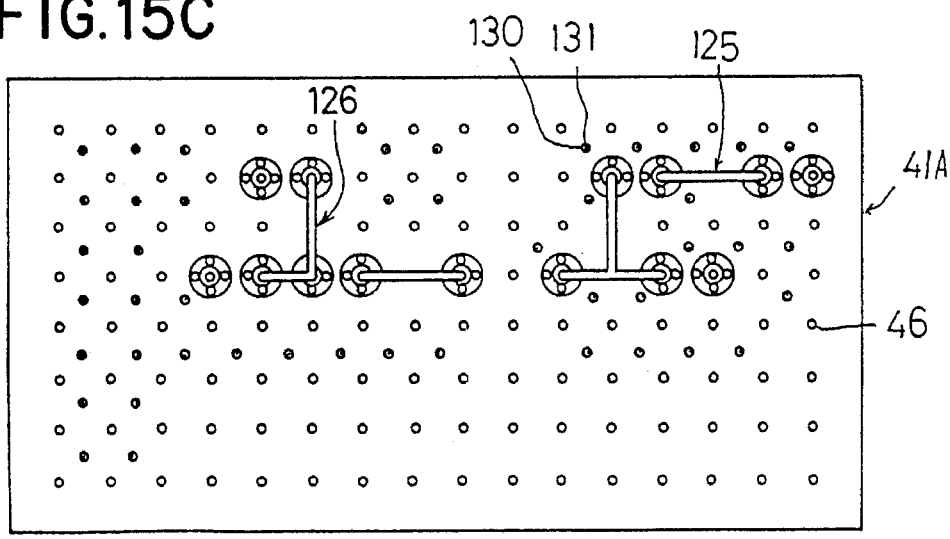
FIG. 15C is a bottom view of the gas supplying apparatus shown in FIG. 14.
Figure 16A:
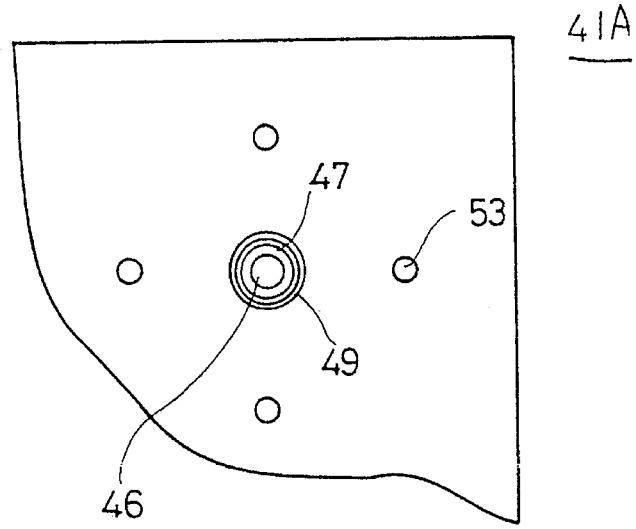
FIG. 16A is an enlarged plan view of a part of a base plate shown in FIG. 14.
Figure 16B:
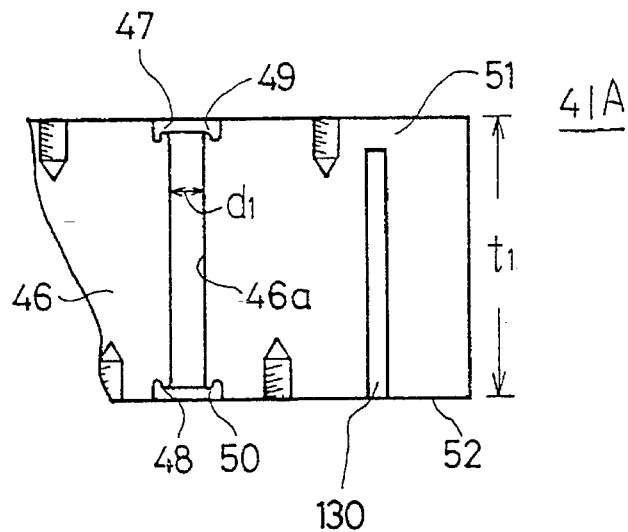
FIG. 16B is an enlarged cross sectional view of the part of the base plate shown in FIG. 16A.
Figure 16C:
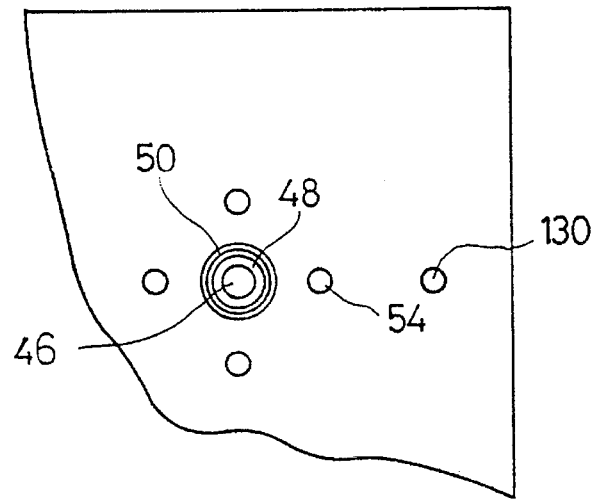
FIG. 16C is an enlarged bottom view of the part of the base plate shown in FIG. 16A.
Figure 18:
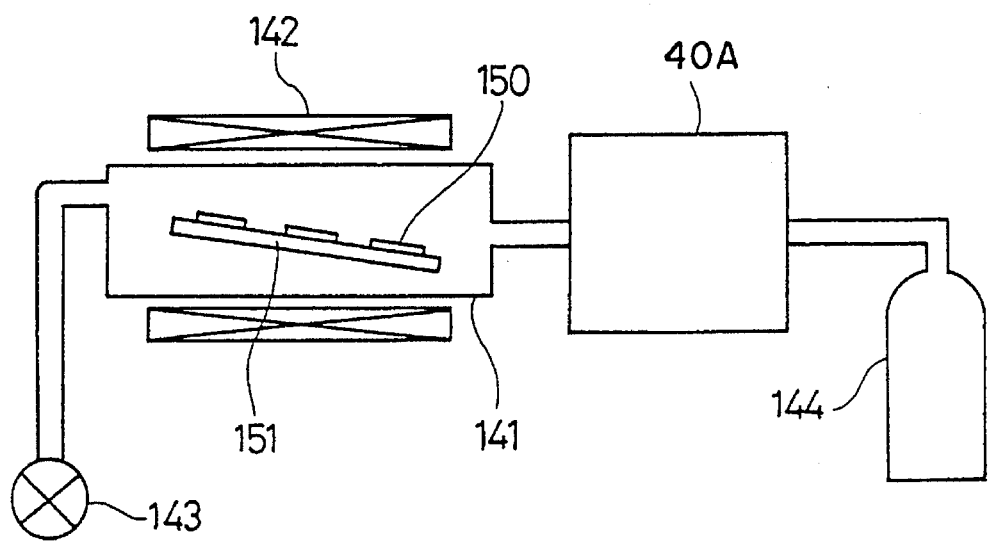
FIG. 18 is an illustration of a chemical vapor deposition apparatus in which the gas supplying apparatus shown in FIG. 14 is used.

A description will now be given of an application of the gas supplying apparatus according to the present invention. The gas supplying apparatus 40A shown in FIG. 14 is used in a chemical vapor deposition apparatus 140 shown in FIG. 18.

A reaction chamber 141 is heated by a heater 142, and evacuated by a vacuum pump 143 to a predetermined pressure. In the reaction chamber 141, there is provided a wafer 150 as a substrate mounted on a susceptor 151. The gas supplying apparatus 40A is provided between the reaction chamber 141 and a gas cylinder 144 which stores a trichlorosilan gas. The trichlorosilan gas is supplied from the gas cylinder 144 to the gas supplying apparatus 40A, and then introduces into the reaction chamber 141 under a predetermined condition. The gas supplying apparatus 40A serves to control a mass flow of the trichlorosilan gas in a constant condition. Due to the constant mass flow of the trichlorosilan, a high quality silicon layer is deposited on the wafer 150 in the reaction chamber 141, and thus a high yield rate of semiconductor devices can be obtained by using the above-mentioned CVD apparatus 140.

The present invention is not limited to the specifically disclosed embodiments, and variations and modifications may be made without departing from the scope of the present invention.

What is claimed is:

1. A gas handling device assembly for controlling a gas, comprising:

a base plate having a top surface and a bottom surface opposite to said top surface, a plurality of through holes extending from said top surface to said bottom surface being formed in said base plate so that the gas flows through said through holes;

at least one gas-handling device having a mount surface via which said gas-handling device is fixed to said base plate, an inlet port and an outlet port for the gas being formed on said mount surface so that each of said inlet port and said outlet port is connected to one of through holes of said base plate; and at least one connecting tube having a first connecting member on one end and a second connecting member on the other end, said first connecting member and said second connecting member facing toward the same direction, wherein said gas handling device is fixed to said top surface of said base plate, and said connecting tube is fixed to said bottom surface of said base plate so that said gas handling device, said through holes and said connecting tube together form a gas-flow circuit.

2. The gas handing device assembly as claimed in claim 1, wherein each of said through holes has a smooth inner surface having a maximum roughness of a submicron order of magnitude.

3. The gas handling device assembly as claimed in claim 1, wherein said base plate has a heater hole into which a heater is inserted so that the gas flowing through said through holes of said base plate is heated by means of said heater fitted in said heater hole.

4. The gas handling device assembly as claimed in claim 3, wherein said through holes are arranged in a matrix pattern having a pitch, a distance between said inlet port and said outlet port of said gas handling device being equal to a multiple of the pitch of said matrix pattern of said through holes, a distance between said first connecting member and said second connecting member being equal to a multiple of the pitch of said matrix pattern of said through holes.

5. The gas handling device assembly as claimed in claim 1, wherein said connecting tube comprises a U-shaped tube.

6. A gas handling device used with a base plate to which the gas handling device is fixed, said base plate having a plurality of through holes as passages for a gas, the gas handling device comprising:
- a mount surface via which said gas-handling device is fixed to said base plate; and
- an inlet port and an outlet port for the gas being formed on said mount surface so that each of said inlet port and said outlet port is connected to one of the through holes of said base plate.

7. The gas handling device as claimed in claim 6, comprising valve means so that said gas handling device serves as a stop valve.

8. The gas handling device as claimed in claim 6, comprising pressure controlling means so that said gas handling device serves as a pressure controlling valve.

9. The gas handling device as claimed in claim 6, comprising flow controlling means so that said gas handling device serves as a flow controller.

10. A gas supplying apparatus supplying a gas to an external device, the gas supplying apparatus comprising:
- a base plate having a top surface and a bottom surface opposite to said top surface, a plurality of through holes extending from said top surface to said bottom surface being formed in said base plate so that the gas flows through said through holes;
- a stop valve having a mount surface via which said stop valve is fixed to said base plate, an inlet port and an outlet port for the gas being formed on said mount surface so that each of said inlet port and said outlet port is connected to one of through holes of said base plate;
- a pressure controlling valve having a mount surface via which said pressure controlling valve is fixed to said base plate, an inlet port and an outlet port for the gas being formed on said mount surface so that each of said inlet port and said outlet port is connected to one of through holes of said base plate;
- a flow controller having a mount surface via which said flow controller is fixed to said base plate, an inlet port and an outlet port for the gas being formed on said mount surface so that each of said inlet port and said outlet port is connected to one of through holes of said base plate; and
- a plurality of connecting tubes each having a first connecting member on one end and a second connecting member on the other end, said first connecting member and said second connecting member facing toward the same direction,
- wherein said stop valve, said pressure controlling valve and said flow controller are fixed to said top surface of said base plate, and said connecting tubes are fixed to said bottom surface of said base plate so that said stop valve, said pressure controlling valve, said flow controller, said connecting tube and said through holes together form a gas-flow circuit.

11. The gas supplying apparatus as claimed in claim 10, wherein each of said through holes has a smooth inner surface having a maximum roughness of a submicron order of magnitude.

12. The gas supplying apparatus as claimed in claim 10, wherein said base plate has a heater hole into which a heater is inserted so that the gas flowing through said through holes of said base plate is heated by means of said heater fitted in said heater hole.

13. The gas supplying apparatus as claimed in claim 12, wherein said through holes are arranged in a matrix pattern having a pitch, a distance between said inlet port and said outlet port of each of said stop valve, said pressure controlling valve and said flow controller being equal to a multiple of the pitch of said matrix pattern of said through holes, a distance between said first connecting member and said second connecting member being equal to a multiple of the pitch of said matrix pattern of said through holes.

14. The gas supplying apparatus as claimed in claim 10, wherein said connecting tube comprises a U-shaped tube.

15. A chemical vapor deposition apparatus comprising:
- a gas cylinder for supplying a process gas;
- a reaction chamber into which the process gas is introduced for performing a chemical vapor deposition; and
- a gas supplying apparatus supplying a gas to an external device,
- wherein said gas supplying apparatus comprising:
  - a base plate having a top surface and a bottom surface opposite to said top surface, a plurality of through holes extending from said top surface to said bottom surface being formed in said base plate so that the gas flows through said through holes;
  - a stop valve having a mount surface via which said stop valve is fixed to said base plate, an inlet port and an outlet port for the gas being formed on said mount surface so that each of said inlet port and said outlet port is connected to one of said through holes of said base plate;
  - a pressure controlling valve having a mount surface via which said pressure controlling valve is fixed to said base plate, an inlet port and an outlet port for the gas being formed on said mount surface so that each of said inlet port and said outlet port is connected to one of said through holes of said base plate;
  - a flow controller having a mount surface via which said flow controller is fixed to said base plate, an inlet port and an outlet port for the gas being formed on said mount surface so that each of said inlet port and said outlet port is connected to one of said through holes of said base plate; and
  - a plurality of connecting tubes each having a first connecting member on one end and a second connecting member on the other end, said first connecting member and said second connecting member facing toward the same direction,
  - wherein said stop valve, said pressure controlling valve and said flow controller are fixed to said top surface of said base plate, and said connecting tubes are fixed to said bottom surface of said base plate so that said stop valve, said pressure controlling valve, said flow controller, said connecting tube and said through holes together form a gas-flow circuit.

16. The chemical vapor deposition apparatus as claimed in claim 15, wherein each of said through holes has a smooth inner surface having a maximum roughness of a submicron order of magnitude.

17. The chemical vapor deposition apparatus as claimed in claim 15, wherein said base plate has a heater hole into which a heater is inserted so that the gas flowing through said through holes of said base plate is heated by means of said heater fitted in said heater hole.

18. The chemical vapor deposition apparatus as claimed in claim 15, wherein said through holes are arranged in a matrix pattern having a pitch, a distance between said inlet port and said outlet port of each of said stop valve, said pressure controlling valve and said flow controller being equal to a multiple of the pitch of said matrix pattern of said through holes, a distance between said first connecting member and said second connecting member being equal to a multiple of the pitch of said matrix pattern of said through holes.

19. The chemical vapor deposition apparatus as claimed in claim 15, wherein said connecting tube comprises a U-shaped tube.

20. A gas supplying method comprising the steps of:
   a) supplying a gas to an inlet port of a gas supplying apparatus comprising at least one gas handling device, a base plate having a plurality of through holes and at least one connecting tube, said gas supplied to said gas supplying apparatus flowing into a gas controlling device via one through hole formed in said base plate and flowing out to another through hole, a flowing direction of said gas flow being U-turned by said gas controlling device and said connecting tube; and
   b) discharging said gas from an outlet of said gas supplying apparatus so that said gas is supplied to an apparatus using said gas at a condition, said condition being established by said gas controlling device.

21. The gas supplying method as claimed in claim 20, wherein said base plate has a top surface and a bottom surface opposite to said top surface, a plurality of through holes extending from said top surface to said bottom surface being formed in said base plate so that the gas flows through said through holes;

said gas-handling device has a mount surface via which said gas-handling device is fixed to said base plate, an inlet port and an outlet port for the gas being formed on said mount surface so that each of said inlet port and said outlet port is connected to one of through holes of said base plate; and said connecting tube has a first connecting member on one end and a second connecting member on the other end, said first connecting member and said second connecting member facing toward the same direction; and wherein said gas handling device is fixed to said top surface of said base plate, and said connecting tube is fixed to said bottom surface of said base plate so that said gas handling device, said through holes and said connecting tube together form a gas-flow circuit.

22. The gas supplying method as claimed in claim 21, wherein each of said through holes has a smooth inner surface having a maximum roughness of a submicron order of magnitude.

23. The gas supplying method as claimed in claim 21, wherein said base plate has a heater hole into which a heater is inserted so that the gas flowing through said through holes of said base plate is heated by means of said heater fitted in said heater hole.

24. The gas supplying method as claimed in claim 21, wherein said through holes are arranged in a matrix pattern having a pitch, a distance between said inlet port and said outlet port of said gas handling device being equal to a multiple of the pitch of said matrix pattern of said through holes, a distance between said first connecting member and said second connecting member being equal to a multiple of the pitch of said matrix pattern of said through holes.

25. The gas supplying method as claimed in claim 20, wherein said connecting tube comprises a U-shaped tube.

26. The gas supplying method as claimed in claim 20, wherein said gas controlling device comprises a stop valve.

27. The gas supplying method as claimed in claim 20, wherein said gas controlling device comprises a pressure controlling valve.

28. The gas supplying method as claimed in claim 20, wherein said gas controlling device comprises a flow controller.

* * * * *